(12) United States Patent
Ortsiefer

(10) Patent No.: US 7,700,941 B2
(45) Date of Patent: Apr. 20, 2010

(54) SURFACE-EMITTING SEMICONDUCTOR LASER COMPRISING A STRUCTURED WAVEGUIDE

(75) Inventor: Markus Ortsiefer, Garching (DE)

(73) Assignee: Vertilas GmbH, Garching (DE)

( * ) Notice: Subject to any disclaimer, the term of this patent is extended or adjusted under 35 U.S.C. 154(b) by 410 days.

(21) Appl. No.: 11/401,587

(22) Filed: Apr. 11, 2006

(65) Prior Publication Data

US 2006/0249738 A1    Nov. 9, 2006

Related U.S. Application Data

(63) Continuation of application No. PCT/EP2004/011569, filed on Oct. 14, 2004.

(51) Int. Cl.
    *H01L 29/06*    (2006.01)
(52) U.S. Cl. .............................. 257/14; 257/15; 257/17; 257/21; 257/82; 257/85; 438/39; 438/46; 438/47; 438/933
(58) Field of Classification Search .................. 257/79, 257/432, 623, 625, 80, 81, 11–15, 17, 18, 257/21, 22, 82, 85; 372/43.01, 99, 50.124; 438/39, 46, 47, 933
    See application file for complete search history.

(56) References Cited

U.S. PATENT DOCUMENTS

| | | | | |
|---|---|---|---|---|
| 6,052,398 A | * | 4/2000 | Brillouet et al. | 372/46.01 |
| 6,366,595 B1 | * | 4/2002 | Bowler | 372/46.01 |
| 6,717,972 B2 | * | 4/2004 | Steinle et al. | 372/50.21 |
| 6,897,993 B2 | * | 5/2005 | Steinle | 359/240 |
| 6,977,424 B1 | * | 12/2005 | Walker et al. | 257/432 |
| 7,103,080 B2 | * | 9/2006 | Ungar | 372/45.01 |
| 7,170,917 B2 | * | 1/2007 | Amann et al. | 372/50.124 |
| 2002/0003823 A1 | * | 1/2002 | Yoshida et al. | 372/46 |
| 2006/0126687 A1 | * | 6/2006 | Amann | 372/43.01 |

FOREIGN PATENT DOCUMENTS

| WO | WO 02/065599 A2 | * | 8/2002 | 372/45 |
|---|---|---|---|---|
| WO | WO 2004/049461 A2 | * | 6/2004 | 372/45 |

* cited by examiner

*Primary Examiner*—Zandra Smith
*Assistant Examiner*—Telly D Green
(74) *Attorney, Agent, or Firm*—Lathrop & Gage LLP

(57) ABSTRACT

A surface-emitting semiconductor laser includes an active zone, the active zone having a p-n-junction and surrounded by a first n-doped semiconductor layer and at least one p-doped semiconductor layer; a tunnel contact layer on the p-side of the active zone; an n-doped current-carrying layer that covers the tunnel contact layer, the n-doped current-carrying layer comprising a raised portion; and a structured layer having an optical thickness at least equal to the optical thickness of the current-carrying layer in the region of the raised portion, wherein the structured layer is disposed on the current-carrying layer within a maximum distance of 2 μm from the raised portion.

16 Claims, 4 Drawing Sheets

SURFACE-EMITTING SEMICONDUCTOR LASER COMPRISING A STRUCTURED WAVEGUIDE

RELATED APPLICATIONS

This application is a continuation of PCT/EP2004/011569, filed Oct. 14, 2004, which claims priority to DE 103 48 211.3, filed Oct. 16, 2003, and to DE 103 53 960.3, filed Nov. 19, 2003, each of which is incorporated herein by reference.

BACKGROUND

Vertical-cavity surface-emitting lasers (VCSELs) are semiconductor lasers in which light emission occurs perpendicularly to the surface of the semiconductor chip. Vertical-cavity surface-emitting laser diodes have a plurality of advantages over conventional edge-emitting laser diodes, such as low electrical power consumption, the possibility of directly inspecting the laser diode on the wafer, simple possibilities for coupling to a fiber optic, production of longitudinal single-mode spectra and the possibility of connecting the surface-emitting laser diodes to a two-dimensional matrix.

In the field of fiberoptic communication technology, there is a need, due to wavelength-dependent dispersion and absorption, for VCSELs in a wavelength range from approximately 1.3 to 2 μm, and in particular for wavelengths of around 1.31 μm or 1.55 μm. Long-wavelength laser diodes, especially for the wavelength range above 1.3 μm, have been produced from InP-based compound semiconductors. GaAs-based VCSELs are suitable for the short-wavelength range of less than 1.3 μm.

The lateral beam profile of laser diodes may be influenced to a significant extent by the definition of the corresponding waveguide. In the case of GaAs-based VCSELs having emission wavelengths below approximately 1.3 μm, the waveguiding is produced by selectively oxidised Al(Ga)As layers (cf. "Electrically Pumped 10 Gbit/s MOVPE Grown Monolithic 1.3 μm VCSEL with GaInNAs Active Region", Electronics Letters, Vol. 38, No. 7 (28 Mar. 2002), pages 322 to 324).

By far the best results, in terms of power, operating temperature, single-mode power and modulation bandwidth, for long-wavelength VCSELs in the wavelength range above 1.3 μm, are obtained with InP-based BTJ (Buried Tunnel Junction) VCSELs.

The production and structure of the buried tunnel contact will be described, by way of example, with reference to FIG. 1. Molecular Beam Epitaxy (MBE) is used to produce a highly doped $p^+/n^+$ layer pair 101, 102 having a low band gap. The tunnel contact 103 is formed between these two layers. A circular or elliptical region, which is formed substantially by the $n^+$-doped layer 102, the tunnel contact 103 and a portion of or the entire $p^+$-doped layer 101, is shaped by Reactive Ion Etching (RIE). In a second epitaxy cycle, this region is overgrown with n-doped InP (layer 104), so the tunnel contact is "buried". The contact region between the overgrown layer 104 and the $p^+$-doped layer 101 acts as a barrier layer on application of a voltage. The current flows through the tunnel contact at resistances of typically $3\times10^{-6}\Omega\text{ cm}^2$. The flow of current can thus be restricted to the actual region of the active zone 108. The amount of heat generated is also low, as the current flows from a high-resistance p-doped layer to a low-resistance n-doped layer.

The overgrowing of the tunnel contact leads to slight variations in thickness of the layers located thereabove, as illustrated in FIG. 2, and this has a detrimental effect on lateral waveguiding. In particular, the formation of higher lateral modes is facilitated, especially in relatively large apertures. Only small apertures, and a correspondingly low laser power, may therefore be used for the single-mode operation of conventional VCSELs; this mode is required, for example, in fiberoptic communication technology.

The complete structure of an InP-based VCSEL will now be described, by way of example, with reference to FIG. 2. In this structure, the buried tunnel junction (BTJ) is inverted relative to FIG. 1, so the active zone 106 is located above the tunnel contact, which has a diameter $D_{BTJ}$ and is disposed between the $p^+$-doped layer 101 and the $n^+$-doped 102. The laser radiation emerges in the direction indicated by arrow 116. The active zone 106 is surrounded by a p-doped layer 105 (for example, InAlAs) and by an n-doped layer 108 (for example, InAlAs). The leading-side mirror 109 above the active zone 106 consists of an epitaxial DBR (Distributed Bragg Reflector) comprising approximately 35 InGa(Al)As/InAlAs layer pairs, thus producing a reflectivity of approximately 99.4%. The trailing-side mirror 112 consists of a stack of dielectric layers as the DBR and is completed by a gold layer, thus producing a reflectivity of almost 99.75%. An insulating layer 113 is used for lateral insulation. An annularly structured further p-side contact layer 111 is provided between the layer 104 and the contact layer 114. FIG. 2 illustrates the manner in which the structure of the overgrown tunnel contact is propagated (in this case, downwardly) into the further layers.

The combination of the dielectric mirror 112 and the integrated contact layer 114 and the heat sink 115 results in a markedly increased thermal conductivity compared to epitaxial multilayer structures. Current is injected via the contact layer 114 or via the integrated heat sink 115 and the n-side contact points 110. For further details regarding the production and the characteristics of such VCSEL types, reference is expressly made to the following citations.

A VCSEL having the structure illustrated in FIG. 2 forms the subject-matter of the publication "Low-Threshold Index-Guided 1.5 μm Long-Wavelength Vertical-Cavity Surface-Emitting Laser with High Efficiency", Applied Physics Letters, Vol. 76, No. 16 (17 Apr. 2000), pages 2179 to 2181. A VCSEL of the same type having an output power of up to 7 mW (20° C., CW) is presented in "Vertical-Cavity Surface-Emitting Laser Diodes at 1.55 μm with Large Output Power and High Operation Temperature", Electronics Letters, Vol. 37, No. 21 (11 Oct. 2001), pages 1295 to 1296. The publication "90° C. Continuous-Wave Operation of 1.83-μm Vertical-Cavity Surface-Emitting Lasers", IEEE Photonics Technology Letters, Vol. 12, No. 11 (November 2000), pages 1435 to 1437, relates to a 1.83-μm InGaAlAs—InP VCSEL. "High-Speed Data Transmission with 1.55 μm Vertical-Cavity Surface-Emitting Lasers", Post-Deadline Papers, 28th European Conference on Optical Communication (8 to 12 Sep. 2002) discusses the use of a BTJ-VCSEL for error-free data transmission at modulation frequencies of up to 10 Gbit/s. Finally, a VCSEL having an emission wavelength of 2.01 μm (CW) is known from "Electrically Pumped Room Temperature CW-VCSELs with Emission Wavelengths of 2 μm", Electronics Letters, Vol. 39, No. 1 (9 Jan. 2003), pages 57 to 58.

In contrast to the GaAs-based VCSELs having emission wavelengths below 1.3 μm, the lateral oxidation method may not be used in the BTJ-VCSELs under discussion, since the materials that are used have excessively low aluminium contents, and other conceivable materials, such as AlAsSb, have, to date, not yielded oxide layers of sufficient quality. In the above-discussed BTJ-VCSELs, the lateral waveguiding resulting from the production process accordingly takes place by lateral variation of the length of the resonator. Alternatively, selectively etched-off layers (cf. "1.55-µm InP-lattice-matched VCSELs with AlGaAsSb—AlAsSb DBRs", IEEE Journal on Selected Topics in Quantum Electronics, Vol. 7, No. 2 (March/April 2001), pages 224 to 230), proton implantation (cf. "Metamorphic DBR and Tunnel-Junction Injection: a CW RT Monolithic Long-Wavelength VCSEL", IEEE Journal on Selected Topics in Quantum Electronics, Vol. 5, No. 3 (May/June 1999), pages 520 to 529) or selectively oxidised metamorphic AlAs layers (cf. "1.5-1.6 µm VCSEL for Metro WDM Applications", 2001 International Conference on Indium Phosphide and Related Materials, Conference Proceedings, 13$^{th}$ IPRM (14 to 18 May 2001), Nara, Japan) have, for example, been used in other long-wavelength VCSEL designs.

FIG. 3 illustrates schematically and not to scale the conditions in a known structure of a generic surface-emitting semiconductor laser. The diagram shows the borderline region between the current-carrying layer 7 and an n-doped contact layer 8 having a thickness d3, through which the current is generally supplied and which has preferably grown onto the layer 7 from highly n-doped InGaAs. The raised portion 15 is formed by the overgrowing of the tunnel contact and has a thickness d2 (=raised portion depth). The contact layer 8 is conventionally applied in an epitaxy step and removed by selective etching in the region of the raised portion 15. The structured contact layer 8 typically has a thickness d3 from 50 to 100 nm, to ensure low contact resistances, and, at its inner edge, is at a distance of a plurality of micrometers (typically 4 to 5 µm) from the tunnel contact raised portion 15. In the illustrated structure, the length of the resonator is greater by d2 in the center than in the regions outside the raised portion 15. The effective index of refraction is higher (typically by 1%) in the center than in the outer region, thus resulting in strong index guiding. This favours the formation of higher modes, especially in large apertures.

SUMMARY

An object of the presently described surface-emitting semiconductor lasers is to replace the index guiding, which, in the case of BTJ-VCSELs, is conventionally strong and favors multimode operation, with a weaker index guiding or gain guiding, and also optionally to damp higher lateral modes. The adjustment of the lateral mode profile should allow a single-mode operation even in large apertures having higher single-mode powers than in conventional BTJ-VCSELs.

A surface-emitting semiconductor laser includes an active zone, the active zone having a p-n-junction and surrounded by a first n-doped semiconductor layer and at least one p-doped semiconductor layer; a tunnel contact layer on the p-side of the active zone; an n-doped current-carrying layer that covers the tunnel contact layer, the n-doped current-carrying layer comprising a raised portion; and a structured layer having an optical thickness at least equal to the optical thickness of the current-carrying layer in the region of the raised portion, wherein the structured layer is disposed on the current-carrying layer within a maximum distance of 2 µm from the raised portion.

DETAILED DESCRIPTION

Figure 1:
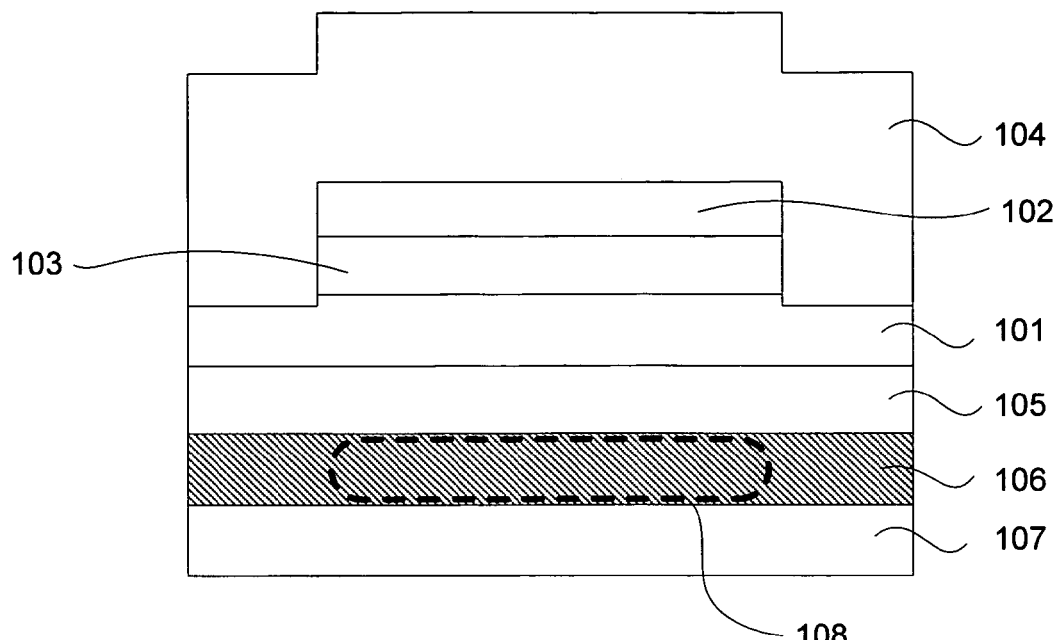
FIG. 1 is a schematic illustration of the structure of a buried tunnel contact in a known surface-emitting semiconductor laser.

To weaken the index guiding, one may apply, at least around the lateral region of the raised portion 15, a structured layer, the optical thickness of which is at least equal to the optical thickness of the current-carrying layer 7 in the region of the raised portion 15, i.e. to the optical thickness of the raised portion 15 having the thickness d2. The structured layer therefore compensates differences in the index of refraction in the center and outer regions of the raised portion 15, as a result of which the index guiding is markedly weakened.

It is therefore necessary that the structured layer is either adjacent to the raised portion 15 or within a specific maximum distance from the raised portion. It has been found that this maximum distance should be no more than 2 µm, but preferably no more than 1 µm. This maximum distance therefore corresponds to 40 to 50%, preferably 20 to 25%, of the previous typical distance of the (optional) contact layer 8 from the outer edge of the raised portion 15 (cf. FIG. 3).

It is preferable if the structured layer is an n-doped contact layer. In this embodiment, the thickness of the contact layer is such that its optical thickness is, for example, equal to the optical thickness of the current-carrying layer in the region of the raised portion 15 of depth d2 (cf. FIG. 3), where for sufficient influencing of the optical field, the contact layer should be no further than 1 to 2 µm from the raised portion.

In another embodiment, the structured layer is provided independently of the optional contact layer. The material from which the structured layer is made may be freely selected, and the layer is preferably directly adjacent to the raised portion in the current-carrying layer. The distance from the raised portion and the thickness of this structured layer are as described above with reference to the embodiment where the contact layer forms the structured layer. The material may, in particular, be selected to damp higher modes, at the edge of the aperture where they have stronger field extensions, thus preventing these modes from oscillating. Materials having a marked absorbing effect for each wavelength are, in general, suitable for this purpose. For wavelengths between 1.3 and 1.55 µm, amorphous silicon is particularly suitable. Titanium is, for example, suitable for the entire conventional wavelength range.

In the aforementioned embodiment, a contact layer surrounding the structured layer may also be provided. The geometry of said contact layer is substantially freely selectable, as the waveguide effect is already compensated by the structured layer.

It has been found that the presently described surface-emitting semiconductor lasers allow the index guiding not only to be weakened, but also to be converted, thus producing an antiguiding effect, which also eliminates higher modes. The (optical) thickness of the structured layer is therefore selected so as to be significantly greater than the depth of the raised portion caused by the tunnel contact. A raised portion is thus produced in the outer region, where if the structured layer has an absorbing effect, the elimination of higher modes is even more effective. In this embodiment having an antiguiding effect, the structured layer that is used may, again, be an n-doped contact layer or a combination of a layer, the material of which may be freely selected, as the structured layer and an optional additional contact layer.

Figure 4:
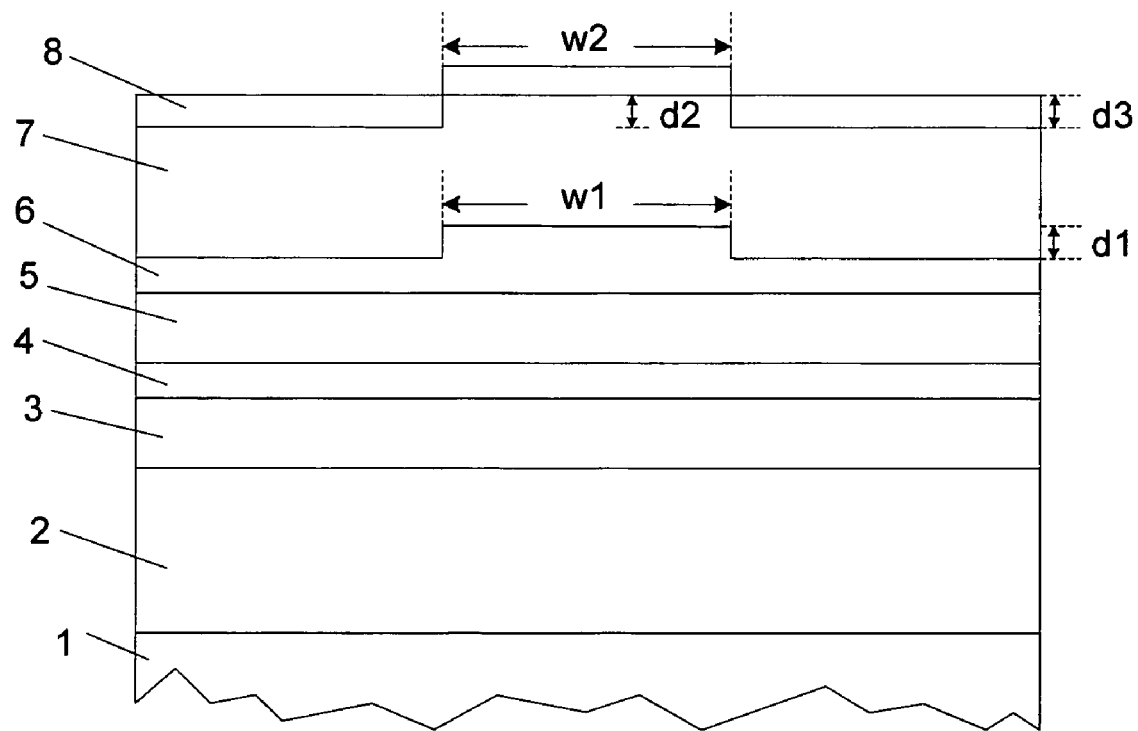
FIG. 4 shows a structure formed during the production of a surface-emitting semiconductor laser according to one embodiment.

FIG. 4 shows the example of a structure formed during the production of a surface-emitting semiconductor laser. Starting from an InP substrate 1, an n-doped epitaxial Bragg mirror 2, an n-doped confinement layer 3, an active zone 4 and a p-doped confinement layer 5 are successively applied in a first epitaxial growth process. The structure is completed by the growth of a tunnel contact layer 6 consisting, for example, in each case of a highly $p^+$- and $n^+$-doped InGaAs layer. An aperture, the dimensions of which may be freely selected and which either extends to the layer 5 or ends within the p-doped portion of layer 6, is formed in the subsequent lithographic and etching process. Typical etching depths are, in this case, 20 nm.

In a second epitaxy step, an upper n-doped current-supplying layer 7, preferably consisting of InP, and an optional n-contact layer 8, preferably consisting of highly n-doped InGaAs grown to a thickness d3, are applied. In this second epitaxy step, the lateral semiaxis ratio may be modified or maintained, depending on the process parameters and the epitaxy method (for example, MBE (Molecular Beam Epitaxy), CBE (Chemical Beam Epitaxy) or MOVPE (Metal Organic Vapour Phase Epitaxy)). A modification causes, for example, an elliptical aperture of formerly circular tunnel contacts.

The result is shown in FIG. 4, in which, for example, a round aperture having the diameter w1 is taken as a lithographically defined aperture having an etching depth d1, which, after the overgrowing process, has a diameter w2 with a height d2. The values w2 and d2 generally correspond to the starting data w1 and d1.

It should be expressly noted that apertures other than circular ones may also be used, so the terms "diameter" or "radius", as used herein, do not entail any limitation to circular aperture geometries. Angular, elliptical or any other geometries are also possible, and the disclosed instrumentalities may be transferred to such geometries.

Figure 5:
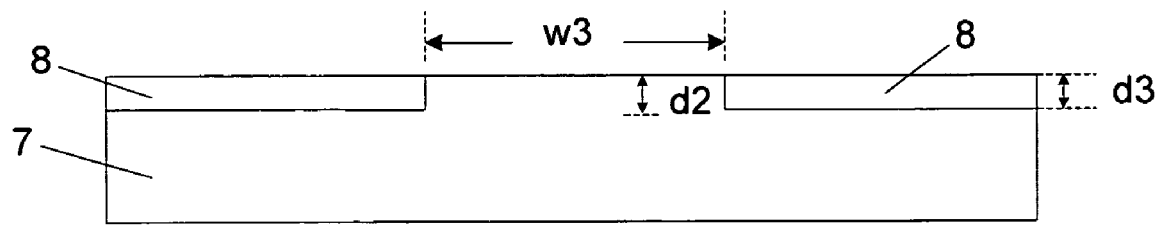
FIG. 5 is a schematic illustration of a contact layer forming a structured layer according to one embodiment.

Starting from the structure illustrated in FIG. 4, the structure obtained after selective etching of the contact layer 8 will now be shown as the embodiment of FIG. 5. In this case, the contact layer 8 acts as the structured layer. The thickness d3 of the contact layer is, for example, selected for complete compensation of the waveguide effect, in such a way that its optical thickness corresponds to the optical thickness in the region of the etching depth d2 of layer 7. An almost planeparallel arrangement is then obtained. In specific regions, the etching diameter w3 may be adjusted in almost any desired manner. For sufficient influencing of the optical field, the radius should, however, typically be no more than 1 μm greater than the radius of the tunnel contact. Further advantageous maximum distances include 0, 0.1, 0.2, 0.3, 0.4, 0.5, 0.6, 0.7, 0.8 and 0.9 μm.

Figure 3:
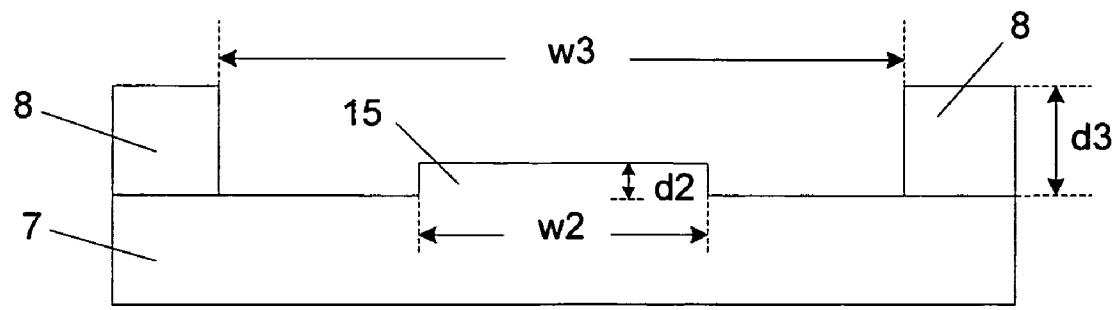
FIG. 3 is a schematic illustration of a contact layer and current-carrying layer in a known structure of a surface-emitting semiconductor laser.

FIG. 5 shows clearly the different conditions achieved by the presently described surface-emitting semiconductor lasers compared to the prior art conditions illustrated in FIG. 3. The presently described structuring causes balancing of the effective index of refraction from the center into the outer regions of the aperture. As a result, the strong index guiding present in FIG. 3 is replaced by weak index guiding.

Figure 6:
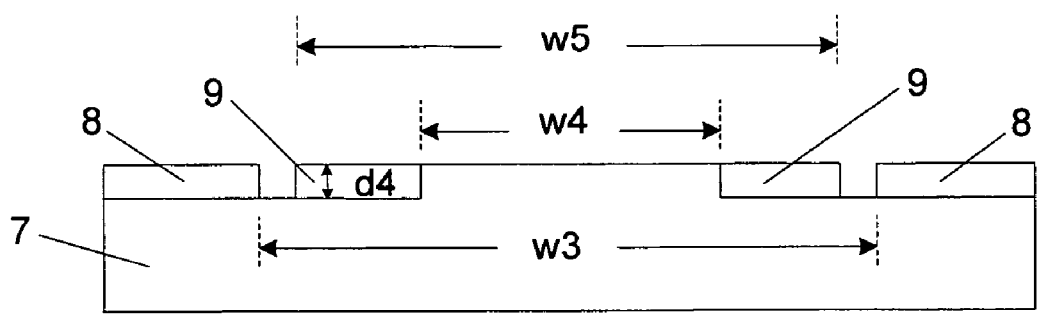
FIG. 6 illustrates a structured layer provided next to a contact layer according to one embodiment.

FIG. 6 shows another embodiment of a waveguide structure. In this arrangement, the contact layer 8 is provided only optionally and may in this case be selectively structured, in a similar manner to that described above, with an opening diameter w3. The waveguide characteristics are, in this case, influenced through an additional layer 9, which may be made from a freely selectable material. Layer 9 has an internal diameter w4 and an external diameter w5, and is structured, for example, by etching processes or a lift-off method. The same principle applies to the dimensions of the thickness d4 and the internal diameter w4 as in the case of the contact layer as the structured layer (FIG. 5). An advantage of this embodiment is the free selection of the material of the structured layer 9. This may, in particular, be used to damp more intense higher modes, which usually have their maximum values at the edge of the aperture, thus preventing these modes from oscillating. Amorphous silicon is a suitable material for the layer 9.

Figure 7:
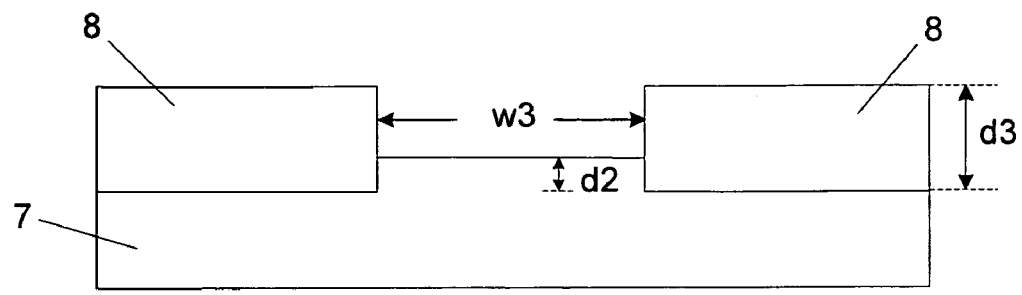
FIG. 7 shows a structure formed during the production of a surface-emitting semiconductor laser having an antiguiding effect according to one embodiment.

FIG. 7 shows another embodiment of the waveguide structure, which has an antiguiding effect. This embodiment is similar to that described in FIG. 5, although in this case the thickness d3 of the contact layer 8, as the structured layer, is selected so as to be significantly greater than the raised portion depth d2 or etching depth d1 of the tunnel contact. This results in heightening of the outer region, leading to an antiguiding effect and also eliminating higher modes. If the layer 8 has an absorbing effect, the elimination of the modes is even more effective. This embodiment illustrated in FIG. 7 may also be combined with the structure shown in FIG. 6. In this case, at least the layer 9 comprises the illustrated raised portion.

Figure 2:
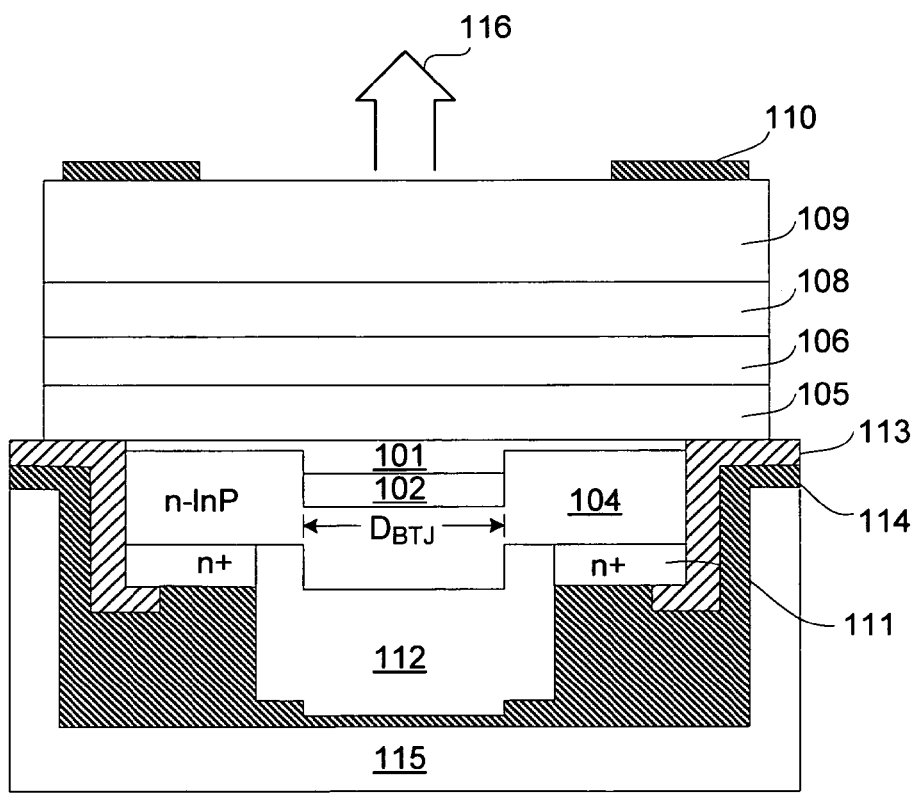
FIG. 2 is a schematic illustration of a complete structure of a known surface-emitting semiconductor laser.
Figure 8:
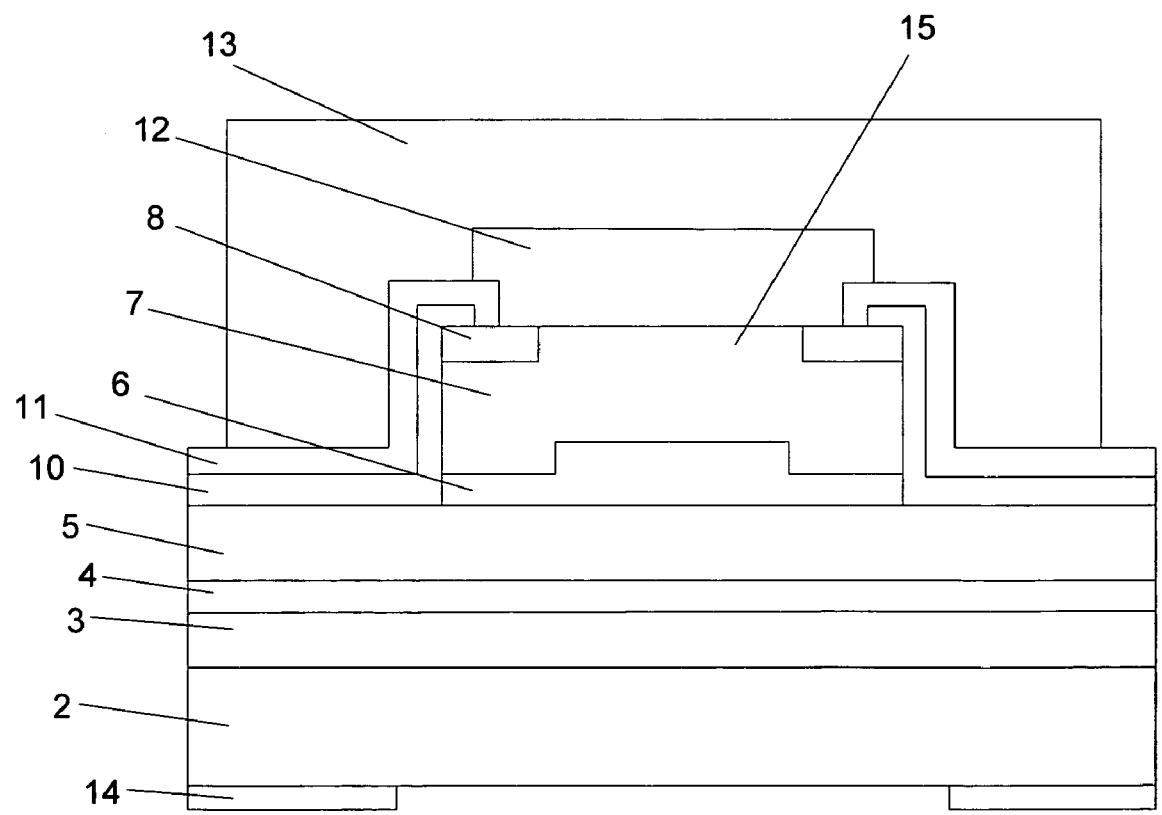
FIG. 8 shows a surface-emitting semiconductor laser according to one embodiment.

FIG. 8 shows the finished BTJ-VCSEL including a surface-emitting semiconductor laser as described herein. The further processing of the structure for forming the finished semiconductor laser has already been described in detail in relation to FIG. 2 in the introductory part of the description. Identical reference numerals denote the same layers as in the structure according to FIG. 4. The InP substrate 1 is, in this case, entirely removed. Instead, an n-side contact 14 consisting, for example, of Ti/Pt/Au is attached to the current supply means. The waveguide structure of the semiconductor laser illustrated in FIG. 8 corresponds to that from FIG. 5 with a contact layer 8 adjacent to the raised portion 15. 10 denotes an insulating and passivation layer, 11 the p-side contact (for example, Ti/Pt/Au), 12 the dielectric mirror, and 13 the integrated heat sink.

The production of BTJ-VCSELs having high single-mode power has been described. The aperture diameters may be enlarged to increase the power, without higher modes being stimulated.

What is claimed is:

1. A surface-emitting semiconductor laser comprising:
    an active zone, the active zone having a p-n-junction and surrounded by a first n-doped semiconductor layer and at least one p-doped semiconductor layer;
    a tunnel contact layer on the p-side of the active zone;
    an n-doped current-carrying layer that covers the tunnel contact layer, the n-doped current-carrying layer comprising a raised portion; and
    a structured layer having an optical thickness at least equal to the optical thickness of the current-carrying layer in the region of the raised portion, wherein the structured layer is disposed on the current-carrying layer within a minimum distance greater than zero and a maximum distance of 2 μm from the raised portion.

2. The semiconductor laser according to claim 1, wherein half of an internal diameter of the structured layer is at most 1 μm greater than half of a diameter of the raised portion.

3. The semiconductor laser according to claim 1, wherein the structured layer is an n-doped contact layer.

4. The semiconductor laser according to claim 3, wherein the structured layer consists of n-doped InGaAs.

5. The semiconductor laser according to claim 1, wherein the structured layer consists of a material that absorbs energy at a wavelength of the semiconductor laser.

6. The semiconductor laser according to claim 5, wherein the material is amorphous silicon.

7. The semiconductor laser according to claim 5, wherein the material is titanium.

8. The semiconductor laser according to claim 1, further comprising an n-doped contact layer laterally disposed around the structured layer.

9. The semiconductor laser according to claim 1, wherein the thickness of the structured layer is an integer multiple of the depth of the raised portion.

10. The semiconductor laser according to claim 2, wherein the structured layer is an n-doped contact layer.

11. The semiconductor laser according to claim 10, wherein the structured layer consists of n-doped InGaAs.

12. The semiconductor laser according to claim 5, further comprising an n-doped contact layer laterally disposed around the structured layer.

13. The semiconductor laser according to claim 8, wherein the thickness of the structured layer is an integer multiple of the depth of the raised portion.

14. The semiconductor laser according to claim 2, further comprising an n-doped contact layer laterally disposed around the structured layer.

15. The semiconductor laser according to claim 1, wherein the minimum distance between the structured layer and the raised portion is 0.1 μm.

16. The semiconductor laser according to claim 15, wherein the minimum distance between the structured layer and the raised portion is 0.5 μm.

* * * * *